US008997321B2

(12) United States Patent
Komuro et al.

(10) Patent No.: US 8,997,321 B2
(45) Date of Patent: Apr. 7, 2015

(54) METHOD OF MANUFACTURING A THIN FILM CAPACITOR HAVING SEPARATED DIELECTRIC FILMS

(71) Applicant: TDK Corporation, Tokyo (JP)

(72) Inventors: Eiju Komuro, Tokyo (JP); Yasunobu Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 57 days.

(21) Appl. No.: 13/661,885

(22) Filed: Oct. 26, 2012

(65) Prior Publication Data
US 2013/0048596 A1 Feb. 28, 2013

Related U.S. Application Data

(62) Division of application No. 12/726,846, filed on Mar. 18, 2010, now abandoned.

(30) Foreign Application Priority Data

Mar. 26, 2009 (JP) .................................. 2009-076361

(51) Int. Cl.
*H01G 7/00* (2006.01)
*H01G 4/30* (2006.01)
*H01G 4/228* (2006.01)
(Continued)

(52) U.S. Cl.
CPC .................. *H01G 4/30* (2013.01); *H01G 4/228* (2013.01); *H01G 4/33* (2013.01); *H01L 28/88* (2013.01); *H01L 28/60* (2013.01); *H01L 28/86* (2013.01)

(58) Field of Classification Search
USPC ................ 29/25.41–25.42, 592.1; 361/306.3, 361/306.1, 311, 313
See application file for complete search history.

(56) References Cited

U.S. PATENT DOCUMENTS 5,208,597 A 5/1993 Early et al.
5,745,335 A 4/1998 Watt
(Continued)

FOREIGN PATENT DOCUMENTS

JP A-55-91112 7/1980
JP A-8-078283 3/1996
(Continued)

OTHER PUBLICATIONS

Translation of Jan. 8, 2013 Office Action issued in Japanese Patent Application No. 2009-076361.

*Primary Examiner* — Minh Trinh
(74) *Attorney, Agent, or Firm* — Oliff PLC

(57) ABSTRACT

A thin film capacitor and a method of manufacturing the same are provided. The thin film capacitor includes a metal foil, dielectric layers and internal electrode layers alternately disposed on the metal foil, and a top electrode layer on the topmost layer among the two or more dielectric layers. These layers have peripheries that define an outer profile flaring toward the metal foil as viewed from the stacking direction of the thin film capacitor, and at least one dielectric layer of two or more dielectric layers satisfies a relationship B>A>0 wherein A is a gap of the periphery of the internal electrode layer directly below the dielectric layer protruding from the periphery of the dielectric layer, and B is a gap of the periphery of the dielectric layer protruding from the periphery of the internal electrode layer or the top electrode layer directly above the dielectric layer. The thin film capacitor has a structure free from short-circuiting and reducing debris of broken dielectric material.

2 Claims, 6 Drawing Sheets

(51) Int. Cl.
  *H01G 4/33*     (2006.01)
  *H01L 49/02*    (2006.01)

(56) References Cited

U.S. PATENT DOCUMENTS

| | | | |
|---|---|---|---|
| 5,818,079 A | 10/1998 | Noma et al. | |
| 6,411,494 B1 * | 6/2002 | Watt | 361/306.3 |
| 6,788,522 B1 | 9/2004 | Sakashita | |
| 7,183,171 B2 | 2/2007 | Huang et al. | |
| 7,224,040 B2 | 5/2007 | Koutsaroff et al. | |
| 7,875,956 B2 | 1/2011 | Koutsaroff et al. | |
| 8,680,649 B2 * | 3/2014 | Guegan | 257/532 |
| 2005/0287755 A1 | 12/2005 | Bachmann et al. | |
| 2007/0209201 A1 | 9/2007 | Koutsaroff et al. | |
| 2008/0037200 A1 | 2/2008 | Koutsaroff et al. | |
| 2008/0186654 A1 | 8/2008 | Takeshima et al. | |

FOREIGN PATENT DOCUMENTS

| | | |
|---|---|---|
| JP | A-2002-025855 | 1/2002 |
| JP | A-2005-243851 | 9/2005 |
| JP | A-2006-511088 | 3/2006 |
| JP | A-2007-512688 | 5/2007 |
| JP | A-2009-218427 | 9/2009 |

\* cited by examiner

Fig.6
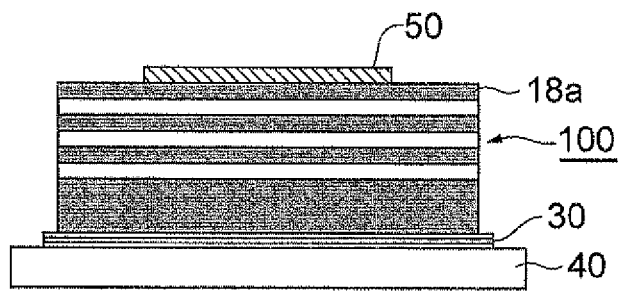
(a)
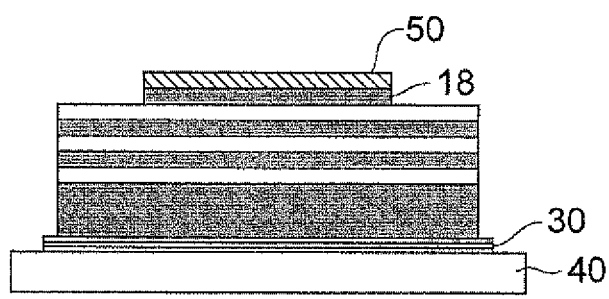
(b)
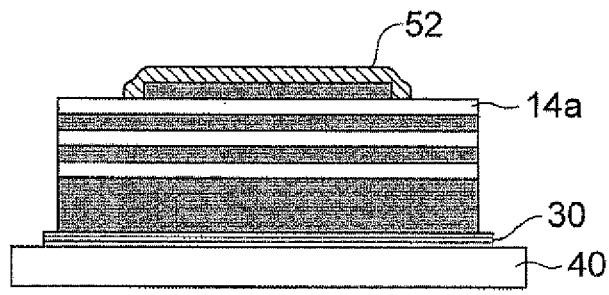
(c)
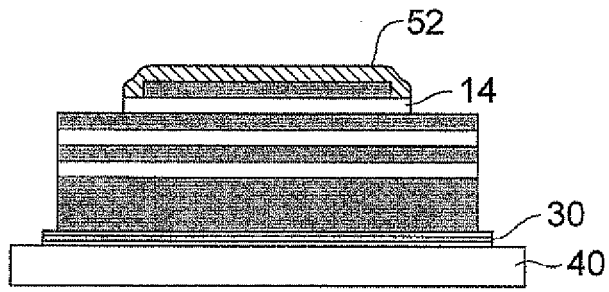
(d)
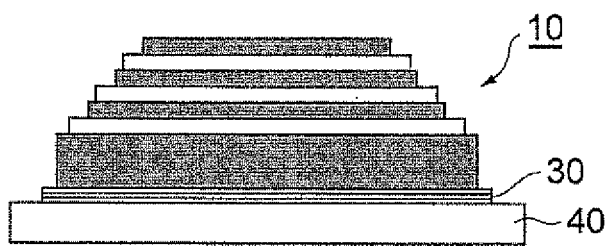
(e)

METHOD OF MANUFACTURING A THIN FILM CAPACITOR HAVING SEPARATED DIELECTRIC FILMS

CROSS-REFERENCE TO RELATED APPLICATION

This is a Divisional of application Ser. No. 12/726,846, filed Mar. 18, 2010, the disclosure of which is hereby incorporated by reference in its entirety.

BACKGROUND OF THE INVENTION

1. Field of the Invention

The present invention relates to a thin film capacitor and a method of manufacturing the same.

2. Related Background Art

Recently, a reduction in profile of electronic components has been accomplished rapidly, resulting in the requirement for a multilayer thin film capacitor that is composed of a lower electrode, alternately disposed dielectric thin films and electrode films, and an upper electrode, in that order. Thin film capacitors having such multilayer dielectric thin films are disclosed in, for example, National Publication of International Patent Application No. 2006-511088 (Patent Literature 1) and Japanese Unexamined Patent Application Publication No. 8-78283 (Patent Literature 2).

In the thin film capacitor described in Patent Literature 1, particularly in FIG. 7D, electrode layers and dielectric layers are alternately deposited on a dielectric base layer into a stepped profile. The dielectric layers have edges flush with those of the alternately-deposited electrode layers in the stacking direction.

The thin film capacitor described in Patent Literature 2, as shown in FIG. 2, is formed by alternately depositing dielectric thin films and metals on a metal foil, each of the metals being deposited through a mask, and processing the resulting stack by ion milling from the topmost layer which is the farthest from the metal foil, for tapering.

Unfortunately, in the thin film capacitor described in Patent Literature 1, because the edges of the dielectric layers are designed to be flush with the edges of the electrode layers in the stacking direction, the edges of the dielectric layers sometimes project like shelves from the electrode layers for the reason of manufacturing tolerances and variations. As a result, the edges of the dielectric layers were broken into debris, which cause a problem particularly in case of forming the thin film capacitor by wet etching.

To cope with the problem, the electrode layer just below one dielectric layer may have an edge protruding from the dielectric layer, however an unnecessary protrusion of the edge could cause a short circuit due to the contact between the protruding electrodes.

The thin film capacitor described in Patent Literature 2 has a structure having tapered side surfaces where electrodes are deposited for electrical connection between the internal electrodes, and thereby adjacent electrodes are easily brought into contact with each other to be a short circuit depending on the accuracy of the patterning of the internal electrodes and the taper etching.

SUMMARY OF INVENTION

An aspect of the present invention has been accomplished in view of the above situation, and is directed to provide a multilayer thin film capacitor that prevents short circuits and reduces debris of broken dielectric material, and a method of manufacturing the same.

A thin film capacitor according to an aspect of the present invention includes a metal foil, two or more dielectric layers on the metal foil, one and more internal electrode layers, each disposed between two adjacent dielectric layers, and a top electrode layer provided on topmost layer among the two or more dielectric layers. These layers have peripheries that define an outer profile flaring toward the metal foil as viewed from the stacking direction of the thin film capacitor, and at least one of two or more dielectric layers satisfy a relationship B>A>0 wherein A is a gap of the periphery of the internal electrode layer directly below the dielectric layer protruding from the periphery of the dielectric layer, and B is a gap of the periphery of the dielectric layer protruding from the periphery of the internal electrode layer or the top electrode layer directly above the dielectric layer.

The thin film capacitor, which satisfies the relationship B>A for the gap A and the gap B with respect to at least one dielectric layer, reduces the risk of the contact between adjacent internal electrodes, and reduces short circuits. The thin film capacitor, which further satisfies the relationship A>0 for the gap A, reduces potential projection of a dielectric layer from the underlying electrode layer during manufacturing, and reduces debris of broken dielectric material.

The gap A is preferably 2 μm or more. This reduces the generation of debris of broken dielectric material.

A method of manufacturing a thin film capacitor according to an aspect of the present invention includes the steps of: (a) alternately depositing dielectric films and conductive films on a metal foil to fabricate a laminated body including two or more dielectric films each disposed between the metal foil and a conductive film farthest from the metal foil, and (b) patterning the laminated body serially from a side of the dielectric film farthest from the metal foil such that these layers have peripheries defining an outer profile flaring toward the bottom of the laminated body as viewed from the stacking direction. In step (b), the dielectric films and the conductive films are processed such that at least one dielectric film of the two or more dielectric films satisfies a relationship B>A>0 wherein A is a gap of the periphery of the conductive film directly below the dielectric film protruding from the periphery of the dielectric film, and B is a gap of the periphery of the dielectric film protruding from the periphery of the conductive film directly above the dielectric film.

In the method of manufacturing the thin film capacitor, the laminated body is processed such that at least one dielectric film satisfies the relationship B>A for the gap A and the gap B, which reduces the risk of the contact between adjacent internal electrodes, and reduces short circuits. The laminated body further satisfies the relationship A>0 for the gap A, which reduces potential projection of a dielectric film from the underlying conductive film during manufacturing, and reduces debris of broken dielectric material.

In the step of processing the laminated body, the patterning may be performed by wet etching. The patterning by the wet etching may cause over etching of the conductive films. In other words, even if a conductive film is etched to an inner part of the edge of the dielectric film thereon, the over etching cannot be observed from the dielectric film above, therefore it is difficult to stop the etching at A=0. Control of the etching by time also precludes completion of the etching at A=0 due to process variation. The processing of the films to satisfy the relationship A>0 for the gap A facilitates visual inspection, and effectively reduces potential projection of a dielectric film from the underlying conductive film.

An aspect of the present invention can provide a thin film capacitor having a structure that prevents short circuits and reduces debris of broken dielectric material, and a method of manufacturing the same.

BRIEF DESCRIPTION OF DRAWINGS

FIGS. 6(a) to 6(e) illustrate the steps of processing a laminated body in a manufacturing process of a thin film capacitor according to an embodiment of the present invention.

DESCRIPTION OF EMBODIMENTS

Figure 1:
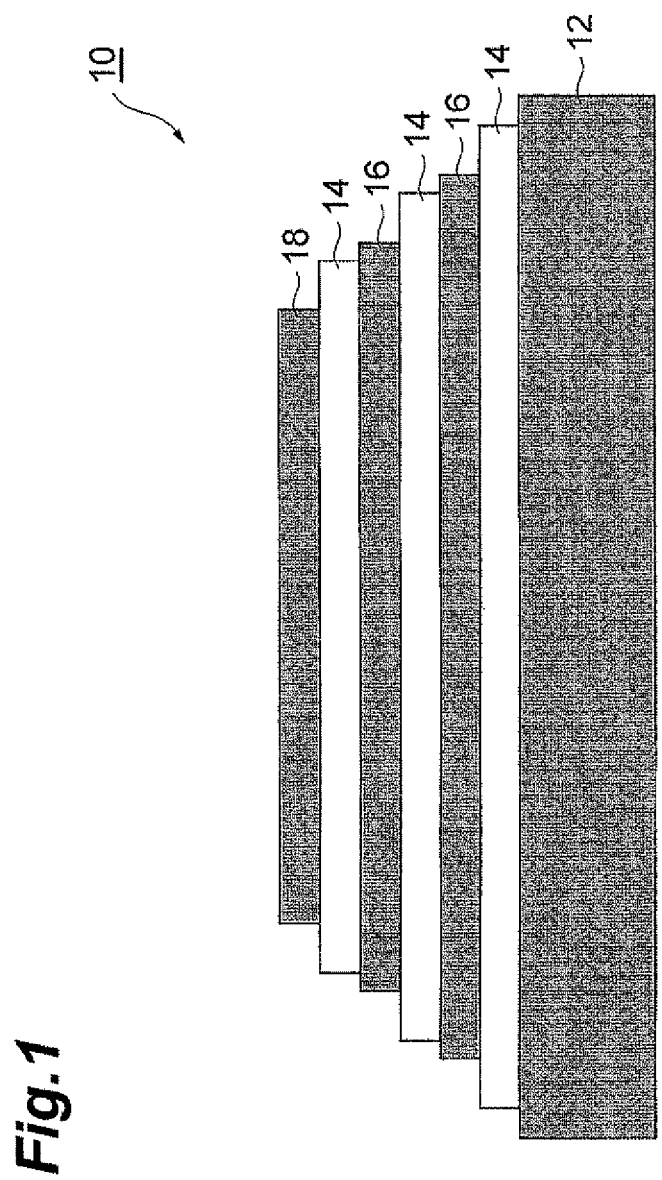
FIG. 1 is a sectional view of a thin film capacitor according to an embodiment of the present invention.

Embodiments of the present invention are explained below with reference to the accompanying drawings. The same elements are designated as the same reference numerals without duplicated explanation thereof.

Figure 2:
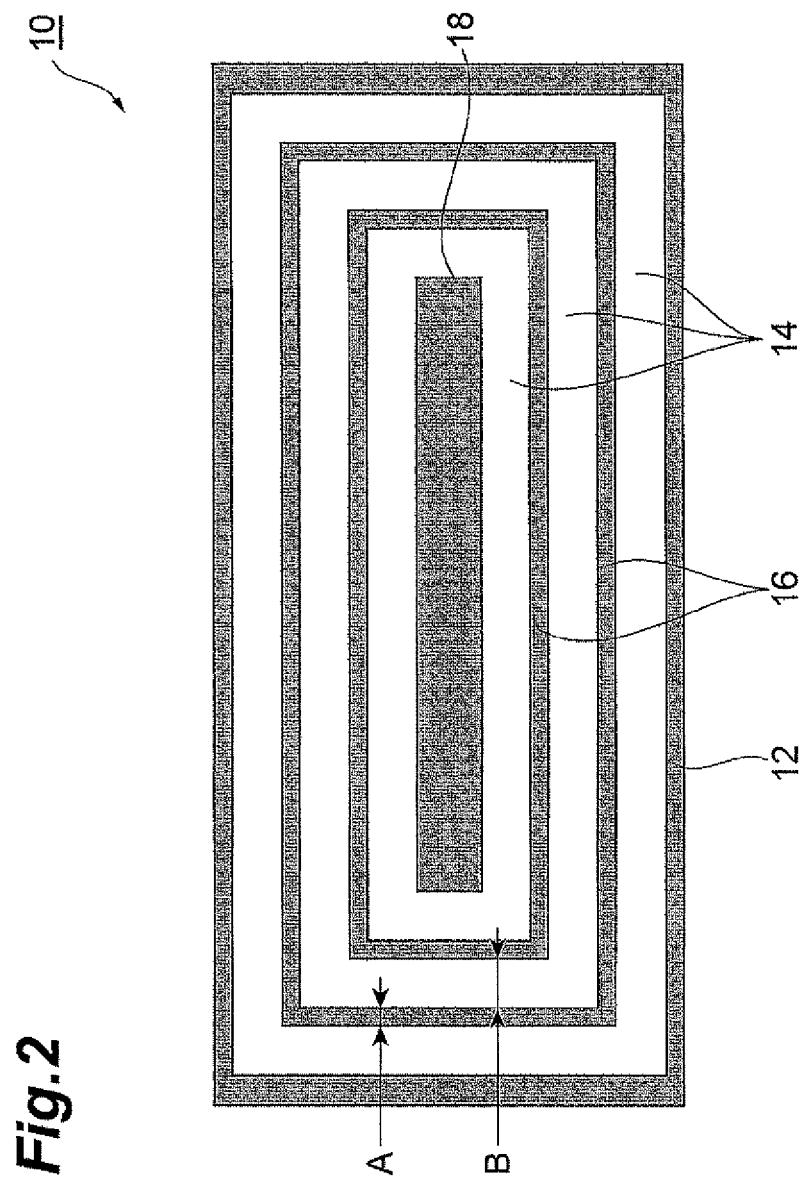
FIG. 2 is a plan view of the thin film capacitor shown in FIG. 1.

FIG. 1 is a sectional view of a thin film capacitor according to an embodiment of the present invention. FIG. 2 is a plan view of the thin film capacitor shown in FIG. 1. As shown in FIGS. 1 and 2, a thin film capacitor 10 includes a laminated body including a metal foil 12, two or more dielectric layers 14 provided on the metal foil 12, internal electrode layers 16 each between two adjacent dielectric layers 14, and a top electrode layer 18 on the topmost dielectric layer 14.

The thin film capacitor 10 uses the metal foil 12 and the top electrode layer 18 as a pair of opposed electrodes. The metal foil 12 is self-supporting, and functions as a base material to support the dielectric layers 14, the internal electrode layers 16, and the top electrode layer 18.

The metal foil 12 is preferably made of a metal composed of at least one base metal selected from Cu, Ni, and Al. In particular, Ni is preferred.

The thickness of the metal foil 12 preferably ranges from 5 to 100 μm, more preferably from 20 to 70 μm, and most preferably about 50 μm. A metal foil 12 with an excessively small thickness is hard to handle during the manufacture of the thin film capacitor 10, whereas a metal foil 12 with an excessively large thickness is less effective in suppressing leak current. In the latter case, it is difficult to repair the deformation including warpage occurring during thermal treatment, by a pressurizing operation. The metal foil 12 has an area of about 1 by 0.5 mm² for example.

The dielectric layers 14 are composed of: a (ferroelectric) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, and $Pb(Zr_xTi_{1-x})O_3$; a complex perovskite relaxor ferroelectric material such as $Pb(Mg_{1/3}Nb_{2/3})O_3$; a bismuth layer-structured compound such as $Bi_4Ti_3O_{12}$ and $SrBi_2Ta_2O_9$; and a tungsten bronze type ferroelectric material such as $(Sr_{1-x}Ba_x)Nb_2O_6$ and $PbNb_2O_6$. Each dielectric layer 14 has a thickness of from 10 to 1000 nm, for example.

The internal electrode layer 16 is made of a metal conductor such as Ni, Cu, Pt, Au, Ir, Ag, Pd, or alloy thereof. The internal electrode layer 16 has a thickness of from 10 to 1000 nm for example.

The upper electrode layer 18 is preferably made of a metal composed of at least one base metal selected from Cu, Ni, and Al, more preferably Cu or Cu alloy.

The thin film capacitor 10 of the embodiment, as shown in FIGS. 1 and 2, has a stepped pyramid-shaped structure, and the outer profile defined by these layers flares toward the bottom of the laminated body along the entire periphery as viewed from the stacking direction of the laminated body. Each dielectric layer 14 satisfies the relationship B>A>0, wherein, A is a gap of the periphery of an internal electrode layer 16 disposed directly below the dielectric layer 14 protruding from the periphery of the dielectric layer 14, and B is a gap of the periphery of the dielectric layer 14 protruding from the periphery of the internal electrode layer 16 or the top electrode layer 18 disposed directly above the dielectric layer 14.

If the value of the gap A approximates that of the gap B as a whole, the value of the gap A may be larger than that of the gap B at some locations. In such a case, the relationship between the gap A and the gap B is determined based on the average of the gaps along the periphery of the layers. In the case where the dielectric layer 14 on one internal electrode layer 16 is shaved off to form a pad region on the internal electrode layer 16 for extraction of a terminal electrode, the relationship between the gap A and the gap B can be disregarded.

Figure 3:
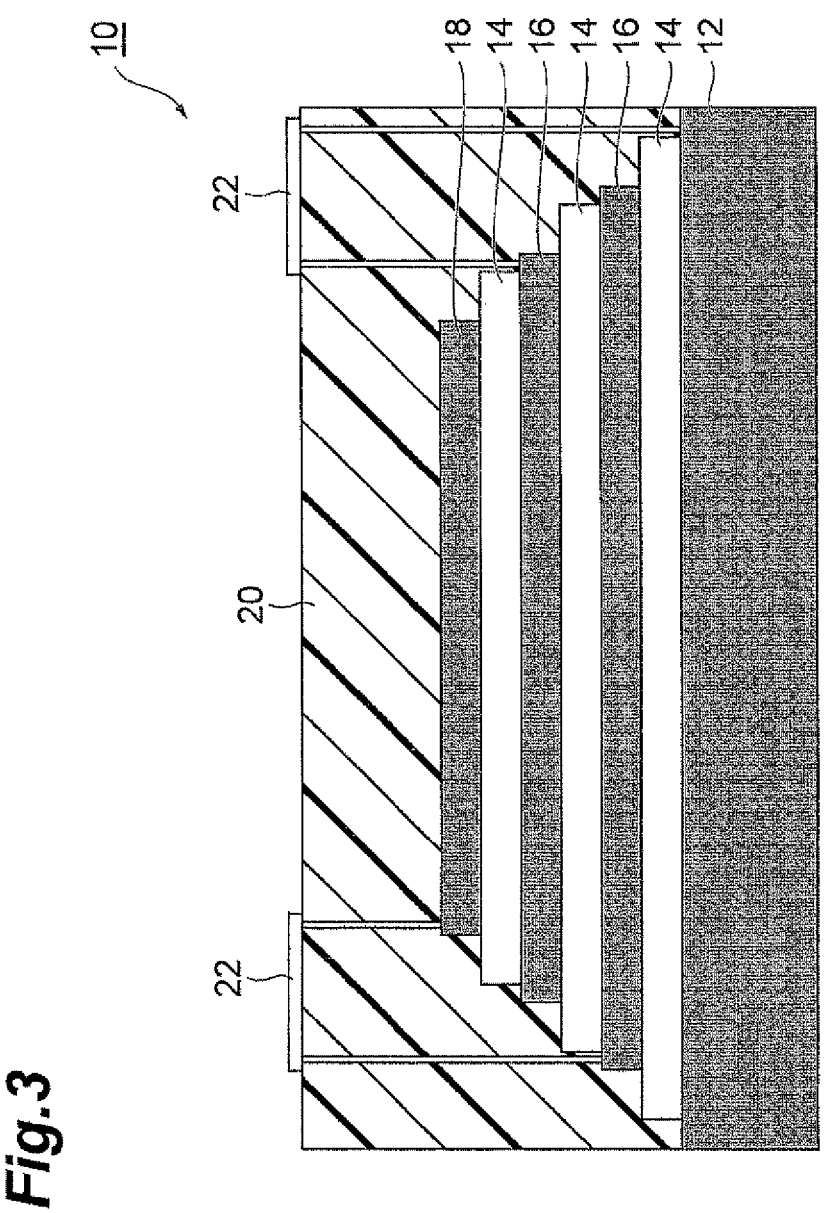
FIG. 3 illustrates the thin film capacitor shown in FIG. 1 provided with a cover layer on the top and terminal electrodes.

FIG. 3 illustrates the thin film capacitor 10 shown in FIG. 1 provided with a cover layer 20 on the top and terminal electrodes 22. The cover layer 20 is composed of an insulating material such as polyimide. The terminal electrodes 22 are composed of a conductive material such as Cu, and are extracted from the metal foil 12, the internal electrode layers 16, and the top electrode layer 18 through the cover layer 20.

Since mutual contact of any two electrodes necessarily causes a short circuit of the thin film capacitor 10, a smaller gap A provided between an internal electrode layer and the overlying dielectric layer 14 can reduce the risk of the short circuit. If the gap A is zero, however, the edge of the internal electrode 16 may reside inner than the edge of the dielectric layer 14 for the reason of manufacturing tolerances and variations. In this case, the edge of the dielectric layer 14 projects like shelves, which may be broken into debris.

During the processing of the dielectric layer 14, if the gap B between one dielectric layer 14 and the overlaying internal electrode layer 16 is large, the distance between the protruding internal electrode layers is increased, which also reduces the risk of the short circuit.

In order to increase a capacitance of the thin film capacitor 10, it preferably includes larger electrodes, and essentially the internal electrode layers 16 and the dielectric layers 14 both preferably have maximum sizes (the dielectric layers 14 preferably has a maximum area to increase the area of the overlaying electrode layers 16). In other words, the gap A and the gap B are preferably as small as possible in consideration of the capacitance. In view of the above condition, the total gap A+B is preferably of from 4 to 25 μm, and more preferably from 5 to 10 μm. The gap A is preferably of from 0 to 10 μm, and more preferably from 2 to 5 μm.

A method of manufacturing the thin film capacitor 10 is explained below with reference to FIGS. 4 to 6.

Figure 4:
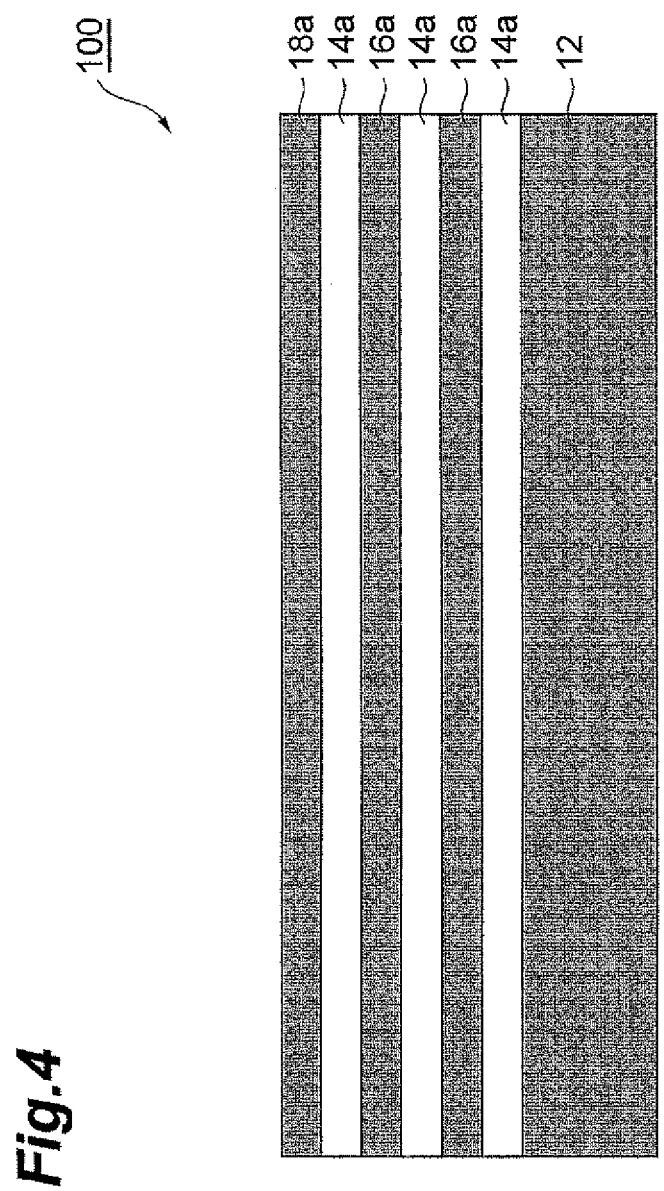
FIG. 4 illustrates a laminated body produced by a manufacturing process of a thin film capacitor according to an embodiment of the present invention.

As shown in FIG. 4, a laminated body 100 is fabricated. A dielectric film 14a is formed over a metal foil 12. The dielectric film 14a has a composition identical to that of a dielectric layer 14 of a thin film capacitor 10 to be finished. The dielectric film 14a may be formed by deposition processes such as a solution coating and firing method including a sol-gel method and a metal organic compound deposition method (MOD), PVD including sputtering, and CVD.

Next, a conductive film 16a is formed over the dielectric film 14a. The conductive film 16a has a composition identical to that of an internal electrode layer 16 of the thin film capacitor 10 to be finished. The conductive film 16a may be formed by a method such as DC sputtering.

A dielectric film 14a is formed over the conductive film 16a. A conductive film 16a is formed over the dielectric film 14a. A dielectric film 14a is formed over the conductive film 16a. This produces a laminated body of the metal foil 12, the dielectric film 14a, the conductive film 16a, the dielectric film 14a, the conductive film 16a, and the dielectric film 14a in sequence.

Each of the dielectric films 14a is fired after being stacked. Preferably, the firing is performed at a temperature that causes sintering (crystallization) of the dielectric films 14a, and specifically ranges from 500 to 1000° C. The firing may be continued for about 5 minutes to about 2 hours. The atmosphere during the firing may be, but not limited to, an oxidizing atmosphere, a reducing atmosphere, or a neutral atmosphere. Preferably, the firing is performed under an oxygen partial pressure which prevents oxidation of at least the metal foil 12 and the conductive films 16a. The firing is not necessary for every stacking of the dielectric films 14a. Two or more or all of dielectric films 14a may be collectively fired.

A conductive film 18a is then formed over the top dielectric film 14a of the fired laminated body. The conductive film 18a has a composition identical to that of a top electrode layer 18 of the thin film capacitor 10 to be finished. This results in the laminated body 100 with the metal foil 12, the dielectric film 14a, the conductive film 16a, the dielectric film 14a, the conductive film 16a, the dielectric film 14a, and the conductive film 18a in sequence. The conductive film 18a over the top dielectric film 14a may be deposited by DC sputtering for example.

Next, the laminated body 100 is processed. As described below, the conductive film 18a, the dielectric films 14a, and the conductive films 16a are successively patterned by wet etching to form a top electrode layer 18, dielectric layers 14, and internal electrode layers 16, respectively. An adhesive sheet 30 and a support 40 are used in the processing of the laminated body 100.

The adhesive sheet 30 is prepared by coating a first and second adhesive layers 34 and 36 (10 to 50 μm) onto both surfaces of a film substrate 32 (100 to 200 μm) of polyester or polyethylene, for example, the adhesive layers 34 and 36 having different decomposition conditions. The first adhesive layer 34 is a mixture of a typical adhesive such as acrylic adhesive, silicone adhesive, or polyester adhesive with thermal expansion microcapsules that expand at a predetermined decomposition temperature (130° C.): This layer 34 loses adhesiveness when heated to 130° C. The second adhesive layer 36 is a mixture of a typical adhesive such as acrylic adhesive, silicone adhesive, or polyester adhesive with thermal expansion microcapsules that expand at a predetermined decomposition temperature (150° C.): This layer 36 loses adhesiveness when heated 150° C. The acrylic adhesive is most preferred due to easy dispersion of the microcapsules.

The support 40 may be a glass substrate. The glass substrate has a thickness of from 500 to 2000 μm for example.

Figure 5:
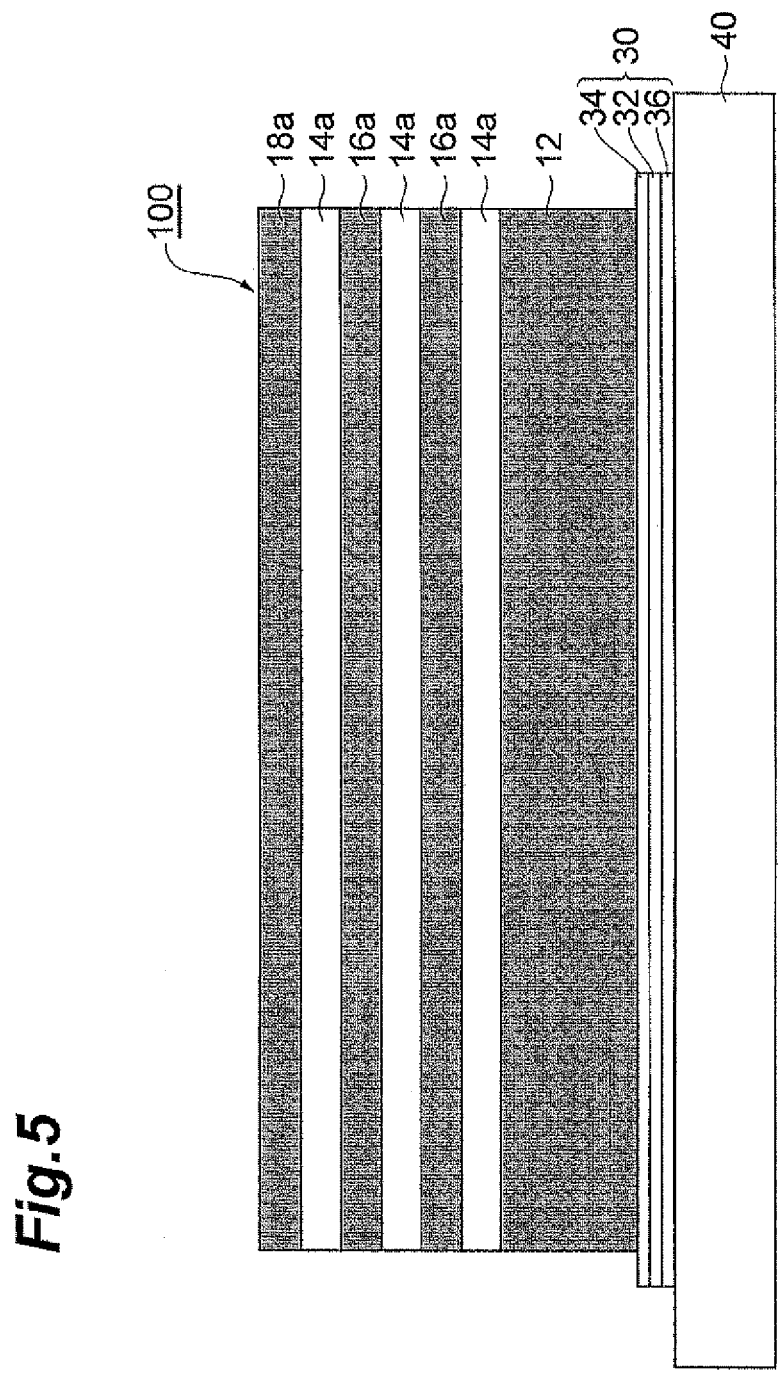
FIG. 5 illustrates a laminated body produced by a manufacturing process of a thin film capacitor according to an embodiment of the present invention, the laminated body being supported by a glass substrate with an adhesive layer therebetween.

As shown in FIG. 5, the laminated body 100 is adhesively fixed to the support 40 using the adhesive sheet 30. In the adhesion process, the first adhesive layer 34 of the adhesive sheet 30 is bonded to the laminated body 100, and the second adhesive layer 36 of the adhesive sheet 30 is bonded to the support 40. Since the laminated body 100 is fixed to the support 40, which is a glass substrate having a flat surface and sufficient thickness, the laminated body 100 can be easily handled, and is prevented from bending.

In order to fix the laminated body 100 to the support 40, a lamination process is preferably performed on the laminated body 100 and the support 40 using a commercially available laminator (Taisei Laminator VAII-700).

As shown in FIG. 6($a$), the conductive film 18a provided on the top of the laminated body 100 is covered with a photoresist. The photoresist may be a dry film resist or a liquid resist. Then, the photoresist is patterned. The photoresist is exposed through a photomask for development. This forms a pattern 50 corresponding to the shape of the top electrode layer 18 on the photoresist.

The conductive film 18a is patterned. The conductive film 18a without the photoresist is wet-etched with an etching solution. This provides the top electrode layer 18 as shown in FIG. 6($b$).

The photoresist 50 is removed, and then the top electrode layer 18 and the dielectric film 14a are covered with another photoresist. Then, the photoresist is patterned as shown in FIG. 6($c$). The photoresist is exposed through a photomask for development. This provides a pattern 52 corresponding to the shape of the dielectric layer 14 on the photoresist.

The dielectric film 14a is patterned. The dielectric film 14a without the photoresist is wet-etched with an etching solution. This provides the dielectric layer 14 as shown in FIG. 6($d$).

The photoresist 52 is removed, and then the top electrode layer 18, the dielectric layer 14, and the conductive film 16a are covered with another photoresist. Then, not shown in the drawing, the photoresist is patterned in the same manner as shown in FIG. 6($c$). The photoresist is exposed through a photomask for development. This provides a pattern corresponding to the shape of the internal electrode layer 16 on the photoresist.

The conductive film 16a is patterned. The portion not covered with the photoresist of the conductive film 16a is wet-etched with an etching solution. This provides the internal electrode layer 16.

As described above, the patterning of the dielectric films 14a and the conductive films 16a are repeated to obtain a thin film capacitor 10 shown in FIG. 6($e$).

In the patterning of the dielectric films 14a and the conductive films 16a, the photoresist is exposed through a photomask of an appropriate size such that each dielectric film 16a satisfies the relationship B>A>0 wherein A is a gap of the periphery of the conductive film 16a disposed directly below the dielectric film 14a protruding from the periphery of the dielectric film 14a, and B is a gap of the periphery of the dielectric film 14a protruding from the periphery of the overlying conductive films 16a and 18a disposed directly above the dielectric film 14a.

Next, the support 40 having the thin film capacitor 10 fixed thereto is placed on a hot plate at a predetermined temperature. The adhesive seat 30 is heated, and the thermal expansion microcapsules in the first adhesive layer 34 expand. As a result, the first adhesive layer 34 decomposes to lose substantial adhesiveness. This facilitates delamination of the thin film capacitor 10 from the support 40. After the delamination, the thin film capacitor 10 is preferably annealed. The annealing may be performed under a reduced-pressure atmosphere at a temperature of from 200 to 400° C. Herein, the reduced-pressure atmosphere represents an atmosphere having a pressure lower than 1 atmospheric pressure (=101325 Pa). The annealing stabilizes electrical characteristics of the capacitor.

As described above in detail, the thin film capacitor 10 and the method of manufacturing the same in this the embodiment, which satisfy the relationship B>A for the gap A and the gap B, reduces the risk of the contact between adjacent internal electrode layers 16, and reduces short circuits. The thin film capacitor, which further satisfies the relationship A>0 for the gap A, reduces generation of debris of broken dielectric material by reducing potential projections of the dielectric layers 14 from the underlying internal electrode layers 16 during manufacturing.

The gap A of 2 μm or more further reduces the generation of debris of broken dielectric material.

In a step of processing the laminated body 100 in this embodiment, the patterning by the wet etching may cause over etching of the conductive films 16a. However, the processing of the films to satisfy the relationship A>0 for the gap A effectively reduces potential projection of a dielectric layer 14 from the underlying internal electrode layers 16.

The formation of dielectric layers and internal electrode layers by mask deposition as described in Patent Literature 2 causes blurs during the mask deposition, which hinders accurate processing in microns, and often causes short circuits. The above described use of the photoresist and the wet etching, however, enables more accurate patterning than the mask deposition.

The present invention is not limited to the above embodiment, and can be variously modified. For example, although three dielectric layers 14 are used in the above embodiment, any number of the layers more than two may be used. In addition, not all of the dielectric layers 14, but at least one dielectric layer 14 needs to satisfy the relationship B>A>0.

EXAMPLES

The present invention is explained below in more detail with reference to examples. The present invention, however, is not limited to the following examples.

Example 1-1

A thin film capacitor 10 was fabricated by the following process: First, a barium titanate (BT) solution was applied to a polished Ni foil (thickness: 50 μm, size: 80 by 80 mm) as a metal foil 12, by chemical solution deposition (CSD), and then the foil was fired to form a dielectric film 14a having a thickness of 300 nm. As a conductive film 16a, NiPd was deposited on the dielectric film 14a into a thickness of 200 nm by sputtering. After BT, NiPd, and BT were deposited in the same manner as that of the dielectric film 14a, Cu for a conductive film 18a was also deposited to fabricate a laminated body 100. These films were not patterned during or after the depositions.

In order to process (pattern) the laminated body 100, the laminated body 100 having the structure shown in FIG. 4 was fixed to a glass substrate that functions as a support 40 using an adhesive sheet 30 therebetween such that the Ni foil 12 faces to the glass substrate. A commercially available laminator (Taisei Laminator VAII-700) was used for the fixation, and a pressure of 0.4 MPa was applied during the lamination.

First, the Ni foil 12 of the laminated body 100 was fixed to a first adhesive layer 34 of the adhesive sheet 30 using a laminator. Then, a second adhesive layer 36 of the adhesive sheet 30 was fixed to the glass substrate 40. The first adhesive layer 34 of the adhesive sheet 30 loses substantial adhesiveness at a temperature of 150° C. In contrast, the second adhesive layer 36 does not lose substantial adhesiveness by heating.

After the laminated body 100 was fixed to the glass substrate 40, a photoresist was patterned by a normal photolithographic process. Microposit S1830 (Rohm and Haas Electric Materials LLC) was used as the photoresist. After the fabrication of the photoresist pattern, the conductive film 18a composed of Cu was etched, and then the resist was delaminated. In the etching, any solution for Cu that erodes Cu but not the dielectric layer 14a and the photoresist pattern can be used, such as an ammonium peroxodisulfate solution.

The layers of BT, NiPd, BT, NiPd, and BT were etched in sequence through the described-above photolithographic process. In the etching, any solution for NiPd that erodes NiPd but not the BT and the photoresist pattern can be used, such as a ferric chloride solution. In the etching, any solution for BT that erodes BT but not the Ni, NiPd, and the photoresist pattern can be used, such as a mixed solution of ammonium fluoride and hydrochloric acid.

The processing of the laminated body 100 resulted in a pyramid-shaped thin film capacitor 10 shown in FIG. 6(e). In the processing, the gap A in FIG. 2 was set to 3 μm in a photomask (the same setting was applied to all of the NiPd electrodes except the Cu electrodes). The gap B in FIG. 2 was set to 6 μm in the photomask (the same setting was applied to all of the three BT layers). The gap A and the gap B of the actual electrodes and dielectric material had the same values as the set values in the photomask. Then, a cover layer 20 and terminal electrodes 22 was provided to the resulting pyramid-shaped thin film capacitor 10.

The glass substrate 40 having the thin film capacitor 10 fixed thereto was placed on a hot plate at a predetermined temperature. The adhesive sheet 30 was heated to expand the thermal expansion microcapsules in the first adhesive layer 34, and to decompose the first adhesive layer 34 into substantially no adhesiveness. After that, the thin film capacitor 10 was delaminated from the glass substrate 40.

One hundred thin film capacitors 10 were fabricated as described above, which showed a short circuit rate of 2%. In the thin film capacitor 10 having a periphery of 1 mm by 0.5 mm, the total capacitance of the three BT layers was 57 nF. No debris of broken dielectric material was generated.

Comparative Examples 1-1 to 1-3

Under the relationship of A+B=9 for the gap A and the gap B, the thin film capacitors 10 were fabricated as in Example 1-1 except that the gaps A were 0, 6, and 9 μm and the gaps B were 9, 3, and 0 μm, respectively. Table 1 shows the results of Example 1-1 and Comparative Examples 1-1 to 1-3.

TABLE 1

|  | Comparative Example 1-1 | Example 1-1 | Comparative Example 1-2 | Comparative Example 1-3 |
| --- | --- | --- | --- | --- |
| A (μm) | 0 | 3 | 6 | 9 |
| B (μm) | 9 | 6 | 3 | 0 |
| Short circuit rate (%) | 2 | 2 | 15 | 70 |
| Edge breakage | Observed | Not observed | Not observed | Not observed |

In Comparative Example 1-1, although the relationship B>A was satisfied and a short circuit rate of 2% was low, breakages of dielectric edges occurred. In Comparative Examples 1-2 and 1-3, although the relationship A>0 were satisfied and breakages of dielectric edges were not observed, the short-circuiting rates were 15% and 70%, respectively, under the relationship B<A, which were higher than that in Example 1-1.

Example 2-1

Thin film capacitors 10 were fabricated as in Example 1-1 except that the gap A was 2 μm and the gap B was 4 μm. In this Example, the resulting short-circuiting rate was 2%, which was the same as that in Example 1-1.

Comparative Examples 2-1 to 2-4

Under the relationship of A+B=6 for the gap A and the gap B, the thin film capacitors 10 were fabricated as in Example 2-1 except that the gaps A were 0, 3, 4, and 6 μm, and the gaps B were 6, 3, 2, and 0 μm, respectively. Table 2 shows the results of Example 2-1 and Comparative Examples 2-1 to 2-4.

TABLE 2

|  | Comparative Example 2-1 | Example 2-1 | Comparative Example 2-2 | Comparative Example 2-3 | Comparative Example 2-4 |
| --- | --- | --- | --- | --- | --- |
| A (μm) | 0 | 2 | 3 | 4 | 6 |
| B (μm) | 6 | 4 | 3 | 2 | 0 |
| Short circuit rate (%) | 2 | 2 | 15 | 25 | 70 |
| Edge breakage | Observed | Not observed | Not observed | Not observed | Not observed |

In Comparative Example 2-1, although the relationship B>A was satisfied and a low short circuit rate of 2% was low, breakages of dielectric edges occurred. In Comparative Examples 2-2, 2-3, and 2-4, although the relationship A>0 were satisfied and breakages of dielectric edges were not observed, the short-circuiting rates were 15%, 25%, and 70% respectively under the relationship B<A, which were higher than that in Example 2-1.

Example 3-1

Thin film capacitors 10 were fabricated as in Example 1-1 except that the gap A was 2 μm and the gap B was 3 μm. In this Example, the resulting short-circuiting rate was 3%.

Comparative Example 3-1 to 3-3

Under the relationship of A+B=5 for the gap A and the gap B, the thin film capacitors 10 were fabricated as in Example 3-1 except that the gaps A were 0, 3, and 5 μm, and the gaps B were 5, 2, and 0 μm, respectively. Table 3 shows the results of Example 3-1 and Comparative Examples 3-1 to 3-3.

TABLE 3

|  | Comparative Example 3-1 | Example 3-1 | Comparative Example 3-2 | Comparative Example 3-3 |
| --- | --- | --- | --- | --- |
| A (μm) | 0 | 2 | 3 | 5 |
| B (μm) | 5 | 3 | 2 | 0 |
| Short circuit rate (%) | 2 | 3 | 25 | 70 |
| Edge breakage | Observed | Not observed | Not observed | Not observed |

In Comparative Example 3-1, although the relationship B>A was satisfied and a low short circuit rate of 2% was low, breakages of dielectric edges occurred. In Comparative Examples 3-2 and 3-3, although the relationship A>0 were satisfied and breakages of dielectric edges were not observed, the short-circuiting rates were 25% and 70% respectively under the relationship B<A, which were higher than that in Example 3-1.

Example 4

Thin film capacitors 10 were fabricated as in Example 1-1 except that the gap A was 5 μm and the gap B was 20 μm. In this Example, the resulting short circuit rate was 2% as in Example 1-1. No debris of broken dielectric edges was generated. The total capacitance of three BT layers was 45 nF.

These results show that, under the relationship B>A>0, a thin film capacitor having larger gaps A and B also gives a high yield without debris of broken dielectric edges, although larger gaps reduce the total capacitance of the capacitor.

What is claimed is:

1. A method of manufacturing a thin film capacitor, comprising the steps of:
    (a) alternately depositing dielectric films and conductive films on a metal foil to fabricate a laminated body including two or more dielectric films each disposed between the metal foil as a bottom of the laminated body and a conductive film farthest from the metal foil, each of the two or more dielectric films being separated from other of the two or more dielectric film by at least one of the conductive films such that none of the two or more dielectric films is in direct contact with any other of the two or more dielectric films; and
    (b) fixing the laminated body to a support and processing the laminated body by patterning each film serially from a side of the dielectric film farthest from the metal foil such that the dielectric films and conductive films have peripheries defining an outer profile flaring toward the bottom of the laminated body as viewed from the stacking direction, and
    wherein, in step (b), the dielectric films and the conductive films are processed such that at least one dielectric film of the two or more dielectric films satisfies a relationship B>A>0 wherein A is a gap of the periphery of the conductive film directly below the dielectric film protruding from the periphery of the dielectric film, and B is a gap of the periphery of the dielectric film protruding from the periphery of the conductive film directly above the dielectric film.

2. The method of manufacturing the thin film capacitor of claim 1, wherein
    in step (b), each film of the laminated body is patterned by wet etching.

* * * * *